(12) United States Patent
Kwak et al.

(10) Patent No.: US 12,080,549 B2
(45) Date of Patent: Sep. 3, 2024

(54) SEMICONDUCTOR STRUCTURE WITH NANOFOG OXIDE ADHERED TO INERT OR WEAKLY REACTIVE SURFACES

(71) Applicant: The Regents of the University of California, Oakland, CA (US)

(72) Inventors: Iljo Kwak, San Diego, CA (US); Kasra Sardashti, Durham, NC (US); Andrew Kummel, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 336 days.

(21) Appl. No.: 17/397,640

(22) Filed: Aug. 9, 2021

(65) Prior Publication Data

US 2022/0319830 A1 Oct. 6, 2022

Related U.S. Application Data

(62) Division of application No. 15/832,212, filed on Dec. 5, 2017, now Pat. No. 11,127,590.
(Continued)

(51) Int. Cl.
*H01L 21/02* (2006.01)
*B82Y 10/00* (2011.01)
(Continued)

(52) U.S. Cl.
CPC .......... *H01L 21/0228* (2013.01); *B82Y 10/00* (2013.01); *H01L 21/02178* (2013.01);
(Continued)

(58) Field of Classification Search
CPC .......... H01L 21/0228; H01L 21/02178; H01L 21/02181; H01L 21/022; H01L 21/3105;
(Continued)

(56) References Cited

U.S. PATENT DOCUMENTS

| 2001/0018407 A1 | 8/2001 | Kakizawa et al. |
| 2002/0115252 A1 | 8/2002 | Haukka et al. |

(Continued)

OTHER PUBLICATIONS

Valdesueiro et al., "Gas-Phase Deposition of Ultrathin Aluminum Oxide Films on Nanoparticles at Ambient Conditions", Materials, 2015, pp. 1249-1263, vol. 8, MDPI.
(Continued)

*Primary Examiner* — Wasiul Haider
(74) *Attorney, Agent, or Firm* — Greer, Burns & Crain, Ltd.; Steven P. Fallon

(57) ABSTRACT

A semiconductor structure includes a nanofog oxide adhered to an inert 2D or 3D surface or a weakly reactive metal surface, the nanofog oxide consisting essentially of 0.5-2 nm $Al_2O_3$ nanoparticles. The nanofog can also consists of sub 1 nm particles. Oxide layers can be formed on the nanofog, for example a bilayer stack of $Al_2O_3$—$HfO_2$. Additional examples are from the group consisting of $ZrO_2$, $HfZrO_2$, silicon or other doped $HfO_2$ or $ZrO_2$, $ZrTiO_2$, $HfTiO_2$, $La_2O_3$, $Y_2O_3$, $Ga_2O_3$, GdGaOx, and alloys thereof, including the ferroelectric phases of $HfZrO_2$, silicon or other doped $HfO_2$ or $ZrO_2$. The structure provides the basis for various devices, including MIM capacitors, FET transistors and MOSCAP capacitors.

19 Claims, 7 Drawing Sheets

Related U.S. Application Data

(60) Provisional application No. 62/429,938, filed on Dec. 5, 2016.

(51) Int. Cl.

| | | |
|---|---|---|
| *H01L 21/28* | (2006.01) | |
| *H01L 21/3105* | (2006.01) | |
| *H01L 29/06* | (2006.01) | |
| *H01L 29/16* | (2006.01) | |
| *H01L 29/24* | (2006.01) | |
| *H01L 29/423* | (2006.01) | |
| *H01L 29/49* | (2006.01) | |
| *H01L 29/51* | (2006.01) | |
| *H01L 29/66* | (2006.01) | |
| *H01L 29/775* | (2006.01) | |
| *H01L 29/778* | (2006.01) | |
| *H01L 29/786* | (2006.01) | |
| *H10B 63/00* | (2023.01) | |
| *H10N 50/01* | (2023.01) | |
| *H10N 70/00* | (2023.01) | |

(52) U.S. Cl.
CPC ...... *H01L 21/02181* (2013.01); *H01L 21/022* (2013.01); *H01L 21/28194* (2013.01); *H01L 21/3105* (2013.01); *H01L 29/0673* (2013.01); *H01L 29/1606* (2013.01); *H01L 29/24* (2013.01); *H01L 29/42384* (2013.01); *H01L 29/4908* (2013.01); *H01L 29/517* (2013.01); *H01L 29/66439* (2013.01); *H01L 29/66742* (2013.01); *H01L 29/775* (2013.01); *H01L 29/778* (2013.01); *H01L 29/78603* (2013.01); *H01L 29/78645* (2013.01); *H01L 29/78681* (2013.01); *H01L 29/78684* (2013.01); *H01L 29/78696* (2013.01); *H10B 63/30* (2023.02); *H10N 50/01* (2023.02); *H10N 70/011* (2023.02); *H01L 29/0676* (2013.01)

(58) Field of Classification Search
CPC . H01L 29/0673; H01L 29/1606; H01L 29/24; H01L 29/42384; H01L 29/4908; H01L 29/517; H01L 29/66439; H01L 29/66742; H01L 29/775; H01L 29/778; H01L 29/78603; H01L 29/78645; H01L 29/78681; H01L 29/78684; H01L 29/78696; H01L 21/02282; H01L 21/28194

See application file for complete search history.

(56) References Cited

U.S. PATENT DOCUMENTS

| | | |
|---|---|---|
| 2005/0012975 A1 | 1/2005 | George et al. |
| 2006/0068591 A1* | 3/2006 | Radosavljevic .... H01L 29/7834 257/E29.267 |
| 2009/0315016 A1 | 12/2009 | Elam et al. |
| 2010/0055905 A1 | 3/2010 | Kher et al. |
| 2011/0132449 A1 | 6/2011 | Ramadas et al. |
| 2012/0136241 A1 | 5/2012 | Chen et al. |
| 2013/0039859 A1 | 2/2013 | Qu et al. |
| 2013/0241004 A1* | 9/2013 | Yin ................. H01L 21/823807 257/E27.061 |
| 2014/0174927 A1 | 6/2014 | Bashir et al. |
| 2014/0183087 A1 | 7/2014 | Weaver et al. |
| 2014/0220764 A1 | 8/2014 | Bayram et al. |
| 2014/0264224 A1 | 9/2014 | Zhang et al. |
| 2014/0363962 A1* | 12/2014 | Hou ....................... H01L 29/513 438/591 |
| 2015/0093914 A1* | 4/2015 | Yang ................. H01L 21/02178 438/778 |
| 2015/0194234 A1 | 7/2015 | Shin et al. |
| 2015/0314941 A1 | 11/2015 | Ramadas et al. |
| 2016/0304341 A1 | 10/2016 | Bright et al. |
| 2019/0221660 A1* | 7/2019 | Dasgupta ............ H01L 29/7786 |

OTHER PUBLICATIONS

An et al., "Preparation of Al2O3 Thin Films by Atomic Layer Deposition Using Dimethylaluminum Isopropoxide and Water and Their Reaction Mechanisms", Bulletin of the Korean Chemical Society, 2003, pp. 1659-1663, vol. 24, No. 11, Korean Chemical Society.

Morana et al., "ALD Aluminum Oxide as Protective Coating Against Oxidation of LPCVD SiC Microhotplates", 2013 IEEE 26th International Conference on Micro Electro Mechanical Systems (MEMS), 2013, pp. 484-487, IEEE.

Brazeau et al., "Atomic Layer Deposition of Aluminum Oxide Thin Films from a Heteroleptic, Amidinate-Containing Precursor", Chem. Mater., 2008, pp. 7287-7291, vol. 20, No. 23, American Chemical Society.

Rammula et al., "Atomic layer deposition of aluminum oxide films on graphene", IOP Conference Series: Materials Science and Engineering, 2013, pp. 21-24, vol. 49, IOP Publishing Ltd.

Young et al., "Growth and Characterization of Al2O3 Atomic Layer Deposition Films on sp2-Graphitic Carbon Substrates Using NO2/Trimethylaluminum Pretreatment", ACS Applied Materials & Interfaces, 2015, pp. 12030-12037, vol. 7, ACS Publications.

Justice M.P. Alaboson et al., "Seeding Atomic Layer Deposition of High-k Dielectrics on Epitaxial Graphene with Organic Self-Assembled Monolayers", ACS Nano, vol. 5, No. 6, pp. 5223-5232, 2011.

Changhwan Choi and Jack C. Lee, "Scaling equivalent oxide thickness with flat band voltage (Vfb) modulation using in situ Ti and Hf interposed in a metal/high-k gate stack", Journal of Applied Physics, vol. 108, 064107, Sep. 20, 2010.

S. Fadida et al., "Direct observation of both contact and remote oxygen scavenging of GeO2 in a metal-oxide-semiconductor stack", Journal of Applied Physics, vol. 116, 164101, Oct. 22, 2014.

Damon B. Farmer and Roy G. Gordon, "Atomic Layer Deposition on Suspended Single-Walled Carbon Nanotubes via Gas-Phase Noncovalent Functionalization", Nano Letters, vol. 6, No. 4, pp. 699-703, 2006.

Hyoungsub Kim et al., "Engineering chemically abrupt high-k metal oxide/silicon interfaces using an oxygen-gettering metal overlayer", Journal of Applied Physics, vol. 96, No. 6, pp. 3467-3472, Sep. 15, 2004.

Bongki Lee et al., "Conformal Al2O3 dielectric layer deposited by atomic layer deposition for graphene-based nanoelectronics", Applied Physics Letters, vol. 92, 203102, May 20, 2008.

Kiuyan Li et al., "Study of Si kinetics in interfacial SiO2 scavenging in HfO2 gate stacks", Applied Physics Express, vol. 8, 061304, May 28, 2015.

Jun Hong Park et al., "In Situ Observation of Initial Stage in Dielectric Growth and Deposition of Ultrahigh Nucleation Density Dielectric on Two-Dimensional Surfaces", Nano Letters, vol. 15, pp. 6626-6633, Sep. 22, 2015.

\* cited by examiner

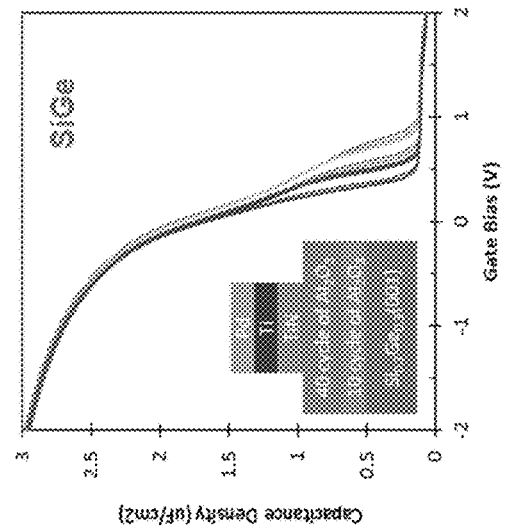
FIG. 5A  FIG. 5B  FIG. 5C
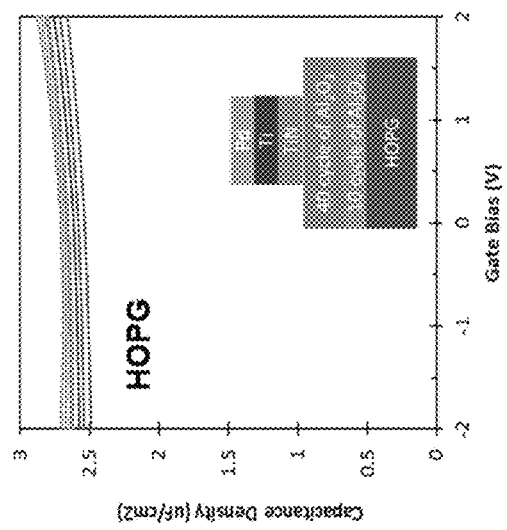
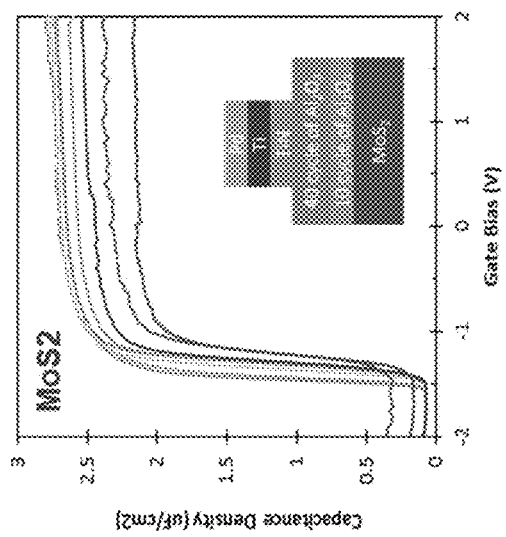
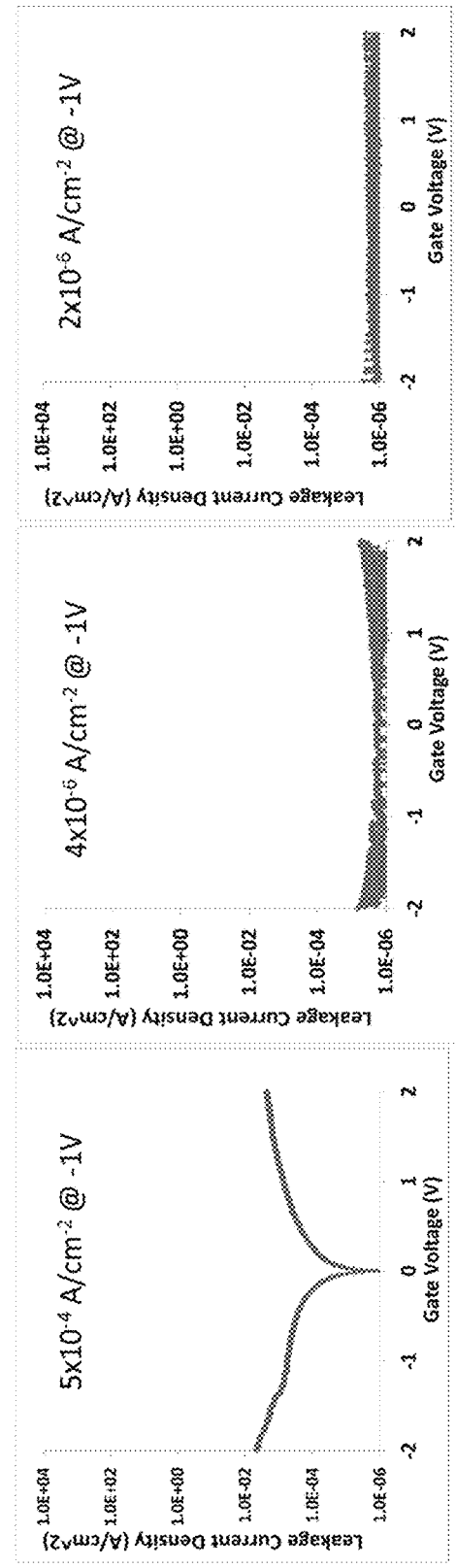
FIG. 5D  FIG. 5E  FIG. 5F

SEMICONDUCTOR STRUCTURE WITH NANOFOG OXIDE ADHERED TO INERT OR WEAKLY REACTIVE SURFACES

PRIORITY CLAIM AND REFERENCE TO RELATED APPLICATION

This application is a divisional of and claims priority under 35 U.S.C. §§ 120 and 121 from pending application Ser. No. 15/832,212, filed Dec. 5, 2017, which application is incorporated by reference herein. This application and the prior pending application claim priority under 35 U.S.C. § 119 and all applicable statutes and treaties from prior U.S. provisional application Ser. No. 62/429,938, which was filed Dec. 5, 2016.

FIELD

A field of the invention is semiconductor fabrication, in particular, the formation of high-k gate oxides. The invention is applicable to formation of high-k gate oxides 2D semiconductor substrates (including graphene, HOPG, and TMDs such $MoS_2$ and $WSe_2$), on 3D structures (e g nanotubes) and other inert surfaces, such as weakly reactive metals. Example applications of the invention include fin field effect transistors (FinFETs) and nanowire field effect transistors (NW-FETs), and Metal-Oxide-Semiconductor capacitors (MOSCAPs). This invention can also be used as a general process to obtain a quality oxide layer for semiconducting devices such as FETs (Field Effect transistor) devices, tunnel devices, threshold switches, memory cell, solar cells and etc. An example application is to selector devices for Resistive RAM. The gate dielectrics can consist of $Al_2O_3$ only or $Al_2O_3$ incorporated at the bottom of $HfO_2$ or other high-k dielectrics such as $ZrO_2$, $HfZrO_2$, silicon or other doped $HfO_2$ or $ZrO_2$, $ZrTiO_2$, $HfTiO_2$, $La_2O_3$, $Y_2O_3$, $Ga_2O_3$, $Gd_3Ga_5O_{12}$, and alloys of these, etc., including the ferroelectric phases of $HfZrO_2$, silicon or other doped $HfO_2$ or $ZrO_2$.

BACKGROUND

Due to inert nature of 2D semiconductors and other inert materials, it is known that typical ALD of gate oxide layers result in a defective oxide layer causing high leakage current. In order to overcome this challenge, prior techniques typically employ functionalization of the surface via chemical treatment (for example $NO_x$ and $O_3$), deposition of oxidizing metal films, polymer based seeding layers. However, there are several disadvantages to these techniques.

One disadvantage is that surface functionalization methods by chemical treatment (using solutions or reactive gases such as $O_3$) can induce defects on the surfaces or unwanted doping of the materials result in degradation of the electronic properties of 2D semiconductors.

To deposit uniform oxide on CNTs which have inert surfaces as 2D semiconductors, Farmer et al., functionalized the surface of CNTs using nitrogen dioxide ($NO_2$) and trimethylaluminum (TMA) at 25° C. to form an $Al_2O_3$ layer by ALD Similarly, $Al_2O_3$ has also been deposited on graphene. However, the induction period for onset of uniform film growth was 100 ALD cycles requiring long processing time. See, D. B. Farmer, and R. G. Gordon, Nano letters 6, no. 4 (2006).

Similarly, several methods have been used to functionalize 2D semiconductor surfaces including chemical treatment, deposition of oxidizing metal films, and polymer based seeding layers. Lee et al., (B. Lee, S. Y. Park, H. C. Kim, K. J. Cho, E. M. Vogel, M. J. Kim, R. M. Wallace, and J. Kim, Applied Physics Letters 92, no. 20 (2008)) reported that $Al_2O_3$ gate dielectric can be formed by an $O_3$-based atomic-layer-deposition process. A disadvantage of this technique is that reactive $O_3$ process can introduce defects on the surface resulting in degradation of the electronic properties of 2D semiconductors. Another functionalization approach is deposition of nucleation seeding layers on 2D semiconductors. Alaboson et al., (Alaboson J M, Wang Q H, Emery J D, Lipson A L, Bedzyk M J, Elam J W, Pellin M J, Hersam M C. ACS nano 2011 May 12; 5(6):5223-32) showed that self-assembled monolayers of perylene-3,4,9, 10-tetracarboxylic dianhydride (PTCDA) act as organic seeding layers for atomic layer deposition (ALD) of $HfO_2$ and $Al_2O_3$ on graphene. The PTCDA is deposited via sublimation in ultrahigh vacuum, therefore this process requires substantial time to prepare the seeding layer and results in thick dielectric layers. Park et al., (J. H. Park, H. C. Movva, E. Chagarov, K. Sardashti, H. Chou, I. Kwak, K. T. Hu, S. K. Fullerton-Shirey, P. Choudhury, S. K. Banerjee, A. C. Kummel, Nano letters 15, no. 10 (2015)) also showed that a flat lying titanyl phthalocyanine (TiOPc) monolayer, deposited via the molecular beam epitaxy, can be a seed layer for atomic layer deposition (ALD) on 2D materials. ALD pulses of trimethyl aluminum (TMA) and $H_2O$ at 120° C. resulted in the uniform deposition of AlOx on the TiOPc/HOPG. However, this technique is not suitable for 3D structures due to directional deposition of MBE.

It is known that titanium (or other oxygen reactive metals) and titanium (or other oxygen reactive metals) on titanium nitride (TiN) gates can be used to reduce the thickness of interface oxide layers in Si, SiGe, InGaAs MOSCAPs by gathering oxygen from the interface. See, S. Fadida et al., "Direct observation of both contact and remote oxygen scavenging of $GeO_2$ in a metal-oxide-semiconductor stack," J. Appl. Phys., vol. 116, no. 16, p. 164101, October 2014; H. Kim, P. C. McIntyre, C. On Chui, K. C. Saraswat, and S. Stemmer, "Engineering chemically abrupt high-k metal oxide/silicon interfaces using an oxygen-gettering metal overlayer," J. Appl. Phys., vol. 96, no. 6, pp. 3467-3472, September 2004; C. Choi and J. C. Lee, "Scaling equivalent oxide thickness with flat band voltage (VFB) modulation using in situ Ti and Hf interposed in a metal/high-k gate stack," J. Appl. Phys., vol. 108, no. 6, p. 64107, September 2010; X. Li, T. Yajima, T. Nishimura, and A. Toriumi, "Study of Si kinetics in interfacial $SiO_2$ scavenging in $HfO_2$ gate stacks," Appl. Phys. Express, vol. 8, no. 6, p. 61304, June 2015.

SUMMARY OF THE INVENTION

A semiconductor structure includes a nanofog oxide adhered to an inert 2D or 3D surface or a weakly reactive metal surface, the nanofog oxide consisting essentially of 0.5-2 nm $Al_2O_3$ nanoparticles. The nanofog can also consists of sub 1 nm particles. Oxide layers can be formed on the nanofog, for example a bilayer stack of $Al_2O_3$—$HfO_2$. Additional examples are from the group consisting of $ZrO_2$, $HfZrO_2$, silicon or other doped $HfO_2$ or $ZrO_2$, $ZrTiO_2$, $HfTiO_2$, $La_2O_3$, $Y_2O_3$, $Ga_2O_3$, GdGaOx, and alloys thereof, including the ferroelectric phases of $HfZrO_2$, silicon or other doped $HfO_2$ or $ZrO_2$. The structure provides the basis for various devices, including MIM capacitors, FET transistors and MOSCAP capacitors.

BRIEF DESCRIPTION OF THE DRAWINGS

FIGS. 5A-5C are capacitance vs. voltage curves of Pd/Ti/TiN/Low temperature $Al_2O_3$ (10 ALD cycles)+$HfO_2$ (40 ALD cycles) on (FIG. 5A) $MoS_2$, (FIG. 5B) HOPG, (FIG. 5C) $Si_{0.7}Ge_{0.3}$ (001) stacks; FIGS. 5D-5F are leakage currents of Pd/Ti/TiN/Low temperature $Al_2O_3$ (10 ALD cycles)+$HfO_2$ (40 ALD cycles) on (FIG. 5D) $MoS_2$, (FIG. 5E) HOPG, (FIG. 5F) $Si_{0.7}Ge_{0.3}$ (001) stacks

DETAILED DESCRIPTION OF THE PREFERRED EMBODIMENTS

Figure 1A:
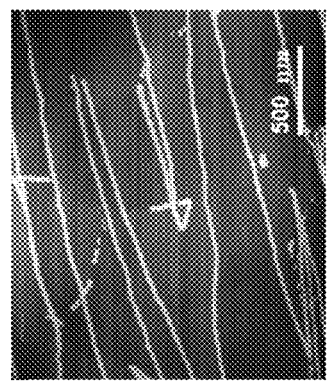
FIGS. 1A-1C are AFM images of $Al_2O_3$ films (50 ALD cycles) on HOPG with respective sample growth temperatures of 200° C., 150° C. and 50° C.

The invention overcomes limitations and disadvantages of prior techniques discussed in the background. The invention provides ALD techniques that enable the deposition of thin and uniform gate dielectric layers, bilayers and multilayers. In accordance with preferred embodiments, gate dielectric layers can be directly deposited on 2D semiconductor surfaces by low temperature ALD without any functionalization methods prior to deposition; In contrast to previous work, ALD can be performed on three dimensional structures and bilayer layer high-K oxide can be deposited. Controlling the pulse times of TMA and $H_2O$ along with a short purge time, 1-2 and sub 1 nanometer diameter spherical $Al_2O_3$ nanoparticles are formed on HOPG, TMDs, SiGe, and weakly reactive metal surfaces consistent with a gas phase reaction of the ALD precursors. With optimized conditions, the formed nanofog of $Al_2O_3$ nanoparticles can consist essentially of sub 1 nm nanoparticles. The nuclei provided uniform nucleation centers on the inert 2D semiconductors surface resulting in uniform and pin-hole free $Al_2O_3$ films on both step edges and terraces. This $Al_2O_3$ layer can be used as a seeding layer for ALD of an $HfO_2$ layer or other high-k oxide which can be deposited at higher temperature and which can be added to provide higher dielectric constant. Preferred high-K oxides include $ZrO_2$, $HfZrO_2$, silicon or other doped $HfO_2$ or $ZrO_2$, $ZrTiO_2$, $HfTiO_2$, $La_2O_3$, $Y_2O_3$, $Ga_2O_3$, $Gd_3Ga_5O_{12}$, and alloys of these, etc., including the ferroelectric phases of $HfZrO_2$, silicon or other doped $HfO_2$ or $ZrO_2$. In making such a bilayer or multi-layer stack of high-K oxide/$Al_2O_3$, high quality oxides with lower EOT values can be achieved. Further lowering of the EOT can be achieve using a remote gettering gate. For 3D object, a rotation during the $Al_2O_3$ layer deposition may be needed to insure uniform coverage. Nearly any other gates oxide or selector oxide could be deposited at the usual high temperature via ALD on the $Al_2O_3$ seed layer.

The invention overcomes limitations and disadvantages prior techniques discussed in the background. This invention provides methods to deposit high-k gate dielectrics via atomic layer deposition (ALD) on 2D semiconductor substrates (including graphene, HOPG (Highly oriented pyrolytic graphite), and TMDs (transition metal dichalcogenides) such $MoS_2WSe_2$, of 3D version of 2D semiconductor such as nanotube, and other inert 2D or 3D surfaces such as weakly reactive metals directly upon without any surface treatments or seeding layers (such as metallic Al or $O_3$ or $NO_x$). This ALD technique ALD can be directly applied upon any 2D or 3D semiconductors to deposit very thin gate oxides stacks because the gas phase formation of nanonuclei is not dependent on the surface. This invention can also be applied to inert metals or weakly reactive such metals such as Pt, Au, Ru, etc., which can be used as the substrate film for a selector in memory devices. This invention can also be used as a general process to obtain a quality oxide layer for semiconducting devices such as FETs, tunnel devices, threshold switch, memory cell, solar cells and etc. An example is selector devices for Resistive RAM.

In this invention, ALD of uniform and insulating gate dielectric films can be achieved on any 2D semiconductors or 3D structures (3D may require substrate rotating), including inert surfaces or weakly reactive surfaces without an ALD induction period prior to onset of uniform film growth. In addition, preferred methods remove the need for the surface functionalization processes of 2D semiconductors (or inert surface or weakly reactive surface) prior to ALD enabling more efficient fabrication of 2D semiconductor devices (or a device such as a selector on an inert surface or weakly reactive surface).

Preferred embodiments provide a method for depositing high-k gate dielectrics via atomic layer deposition (ALD) on 2D semiconductor substrates (including graphene, HOPG, and TMDs such $MoS_2$) and other inert surfaces (including 3D materials) such as weakly reactive metals without any surface treatments or seeding layers (such as metallic Al or $O_3$ or $NO_x$). The gate dielectrics can consist of $Al_2O_3$ only or $Al_2O_3$ incorporated at the bottom of $HfO_2$ or other high-k as listed above which have higher dielectric constants. $Al_2O_3$ can be directly deposited on 2D semiconductors surfaces by low temperature thermal ALD using trimethylaluminum (TMA) and $H_2O$. With the substrates in a temperature range of 25° C. to 80° C. with 50° C. being optimal in the ALD system employed for the tests, using short purge times between the two precursor pulses and long pulses of the precursors, a CVD growth component was intentionally employed to provide more nucleation sites on the surface. The CVD growth component induces formation of 0.5-2 nanometer $Al_2O_3$ particles (a nanofog) on the surface which provide nucleation centers for uniform deposition. The nanofog of sub 1 nm $Al_2O_3$ particles sticks to even the most inert known surfaces, e.g., graphene and HOPG, even in the absence of defects and are sufficiently reactive to nucleate subsequent ALD at high temperatures. The $Al_2O_3$ film deposited by this method is continuous and uniform without defects. For 3D dimensional 2D semiconductors (nanowires, nanotubes, etc), a uniform coverage of oxide can be deposited around structure by rotation of the substrate at least once during $Al_2O_3$ ALD.

In preferred methods demonstrated experimentally, prior to ALD, 2D experimental semiconductor samples are cleaned by the mechanical exfoliation method using an adhesive tape or they are cleaned via heating in UHV to remove photoresist if they are CVD or MBE grown. Commercially synthesized 2D semiconductors are grown by chemical vapor deposition (CVD), chemical vapor transport, or molecular beam epitaxy (MBE); in the future ALD may be used. This produces 1-10 monolayer films. Exfoliation is only for bulk thick materials and of not of commercial interest. Gate dielectric layers can be deposited in a low vacuum (torr) continuous crossflow chamber but other configurations (showerhead and UHV are possible). Metal surfaces are cleaned by cyclic cleaning with acetone, IPA and Water. To deposit $Al_2O_3$, TMA and $H_2O$ are used as ALD precursors, temperature stabilized at 20° C. The carrier gas can be research purity argon. ALD is employed, each cycle consisting of a sequence of 600 ms TMA pulse, 500 ms Ar purge, 50 ms $H_2O$ pulse, and 500 ms Ar purge. The pulse lengths depend on ALD chamber geometry and size but have shorter purge times and longer pulse times than typical purely ALD TMA reactions at the same temperature. $HfO_2$ or other high-k ALD can be performed subsequently using a wide variety of Hf precursors including hafnium tetrachloride ($HfCl_4$) and Tetrakis(dimethylamido)hafnium (TDMAH) at high temperature since the low T $Al_2O_3$ layer acts as a nucleation layer for the standard $HfO_2$ process. $HfO_2$ ALD is performed by cyclic pulsing of TDMAH or $HfCl_4$ and $H_2O$ in a continuous cross-flow ALD chamber with base pressure of 1.5-2 torr with the substrates temperature over 200° C.

Gettering can also be leveraged to improve dielectric properties. Preferred methods, for example, form an oxygen scavenging metal on a defect free and uniform $Al_2O_3$ layer or forming an oxygen scavenging metal on top of a bilayer stack of nanofog $Al_2O_3$ layer plus a high-k dielectric layer, or a remote gettering gate of Pd/Ti/TiN or another remote gettering material, on top of the nanofog $Al_2O_3$ layer or on top of a high-k dielectric layer on the nanofog $Al_2O_3$ layer.

Preferred ALD techniques at low temperature are of particular interest on 2D semiconductors. (1) Deposition of uniform and insulating gate dielectric films can be achieved on any 2D semiconductors without an ALD induction period prior to onset of uniform film growth. (2) Using preferred methods, it is possible to obviate the need for surface functionalization processes of 2D semiconductors which are typically performed prior to ALD enabling more efficient fabrication of 2D semiconductor devices and no damage to the substrate. This preferred two-step ALD technique can also be applied, for example, to inert metal surfaces to grow oxide, which can be important for a variety of devices including selectors for memory chips.

Preferred embodiments of the invention will now be discussed with respect to the drawings and experiments. The drawings may include schematic representations, which will be understood by artisans in view of the general knowledge in the art and the description that follows. Features may be exaggerated in the drawings for emphasis, and features may not be to scale.

In order to evaluate the oxide quality of oxides formed according to the invention, Metal-Oxide-Semiconductor capacitors (MOSCAPs) were fabricated with HOPG ((Highly oriented pyrolytic graphite), $MoS_2$ and $Si_{0.7}Ge_{0.3}$ substrates. HOPG and $MoS_2$ samples were cleaned by the mechanical exfoliation method using an adhesive tape. The samples were loaded into a commercial ALD reactor (Beneq TFS 200 ALD system) which has a hot wall, crossflow reaction chamber. The reaction chamber was pumped down to 1 mTorr. To deposit $Al_2O_3$, TMA and $H_2O$ were used as ALD precursors, temperature stabilized at 20° C. The carrier gas was research purity argon (Ar, Praxair, 99.9999%) which was flowed at 300 sccm (standard cubic centimeter). 50 cycles of ALD were employed, each cycle consisting of a sequence of 600 ms TMA pulse, 500 ms Ar purge, 50 ms $H_2O$ pulse, and 500 ms Ar purge. For comparison, using identical ALD pulse times, films were grown with sample temperatures between 50° C. to 200° C. to investigate the effect of temperature on the nucleation of $Al_2O_3$. To compare nucleation behavior on a highly reactive substrate, $Al_2O_3$ was deposited on $Si_{0.7}Ge_{0.3}$ (001) substrates using same 50 cycles of ALD at 50° C. sample temperature. Thus, the experiment showed 50 cycle deposition on 2D structures and for bilayer oxides. The use of the 50 cycle deposition and the bilayer with rotation to enable coating of 3D structures has also been demonstrated.

After the ALD process, Ni gates were deposited on the oxide by thermal evaporation. The gates were 50 μm in diameter and 3 nm thick. As a control, $Ni/Al_2O_3/Si_{0.7}Ge_{0.3}/Al$ metal-oxide-semiconductor capacitors (MOSCAPs) were also fabricated with a slightly different process due to different cleaning and contact requirements. Prior to ALD, each $Si_{0.7}Ge_{0.3}$ (001) sample was treated with a 30 s rinse by each of acetone, isopropyl alcohol, and DI water followed by $N_2$ drying. Afterwards, the native oxide was removed by cyclic HF cleaning using a 2% HF solution and DI water at 25° C. for 1 min in each solution for 2.5 cycles. For each SiGe sample, 50 cycles of ALD deposition were followed by Ni gate deposition and 100-nm thick Al back contact deposition using DC sputtering. For all samples, the capacitance-voltage curves were measured in the frequency range of 2 kHz to 1 MHz at room temperature with an HP4284A LCR meter. Leakage current of current of the oxide was obtained in the range of −2V to 2V.

Figure 1B:
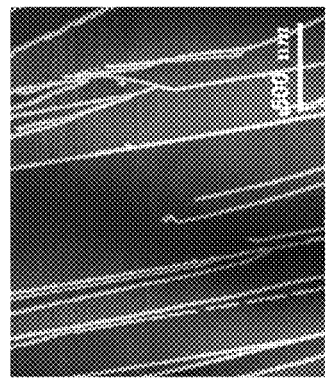
Figure 1C:
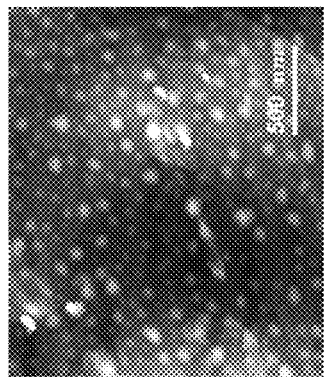

FIGS. 1A-1C are AFM images of $Al_2O_3$ grown on HOPG using 50 cycles of ALD at sample temperatures of 200° C., 100° C., and 50° C. Each ALD cycle for the samples of FIGS. 1A-1C consisted of 600 ms TMA pulse and 50 ms $H_2O$ pulse, with 500 ms Ar purge times between precursor pulses. The growth of $Al_2O_3$ exhibited strong dependence on sample temperature. As shown in FIGS. 1A and 1B, when the sample temperature was above 100° C., $Al_2O_3$ was only deposited on the step edges of the HOPG and not on the terraces, because dangling bonds for nucleation are only available on the step edges and not on the inert terraces. The thickness of the $Al_2O_3$ deposited on the step edges was about 5 nm which is consistent with the expected thickness for 50 cycles of ALD at the typical 0.1 nm/cycle ALD growth rate.

Figure 1D:
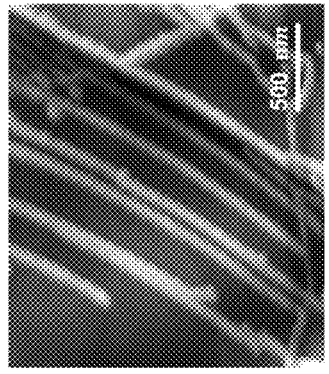
FIG. 1D is an AFM image of 50 ALD cycles of $Al_2O_3$ deposited with 2 s purge times at sample temperature of 50° C., using otherwise identical ALD conditions as for the samples in FIG. 1A.

When the sample temperature was decreased to below 100° C. (50° C.) as shown in FIG. 1C, the $Al_2O_3$ film was deposited continuously on both the step edges and the terraces without pin hole formation. Spherical $Al_2O_3$ features were observed across the entire surfaces for the growth at 50° C. sample temperature. However, these features are only observed with a short purge time between two precursor pulses at 50° C. sample temperature. When the purge time was increased to 2 s with identical precursor ALD pulse times and sample temperature, the spherical $Al_2O_3$ features were not observed as shown in FIG. 1D. Short purge times can induce a chemical vapor deposition (CVD) growth component since excess unreacted physisorbed precursor molecules have insufficient time to desorb from both the substrate and chamber walls during the short purge time. The CVD component induced deposition of particles of about 2±0.4 nm diameter which was quantified by averaging 10 AFM line scans. $Al_2O_3$ particles on the surface were formed by either nucleation in the ALD chamber and subsequently transported to the sample surface or were formed by precursor islands on the surface. Since surface island growth is usually non-spherical and similar nuclei were also observed on the $MoS_2$ and reactive SiGe surface, the data is most consistent with nuclei formation in the ALD chamber.

Figure 2C:
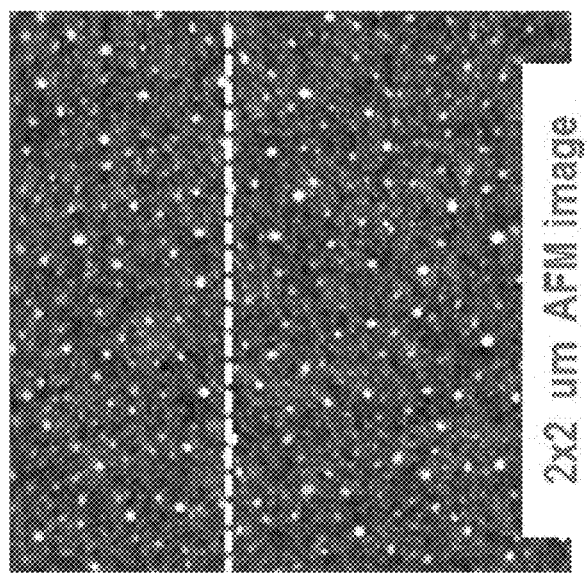
FIGS. 2A-2C are AFM images of $Al_2O_3$ films (50 ALD cycles) on (a) $MoS_2$, (b) HOPG (c) $Si_{0.7}Ge_{0.3}$ (001) grown at 50 C sample temperature.
Figure 2B:
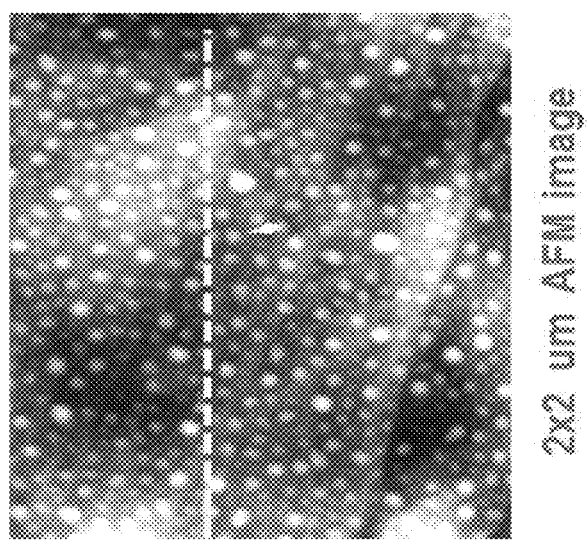
Figure 2A:
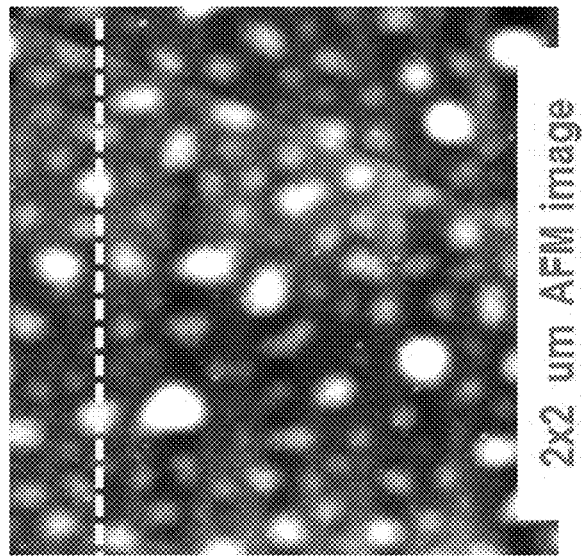
Figure 2F:
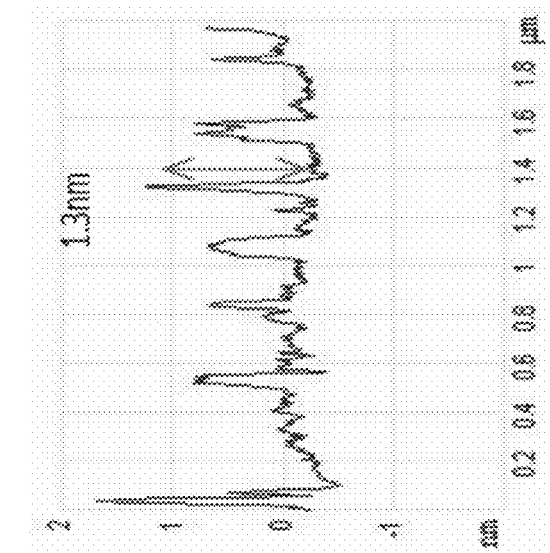
FIGS. 2D-2F are line profiles taken along the dotted lines in FIGS. 2A-2C, respectively.
Figure 2E:
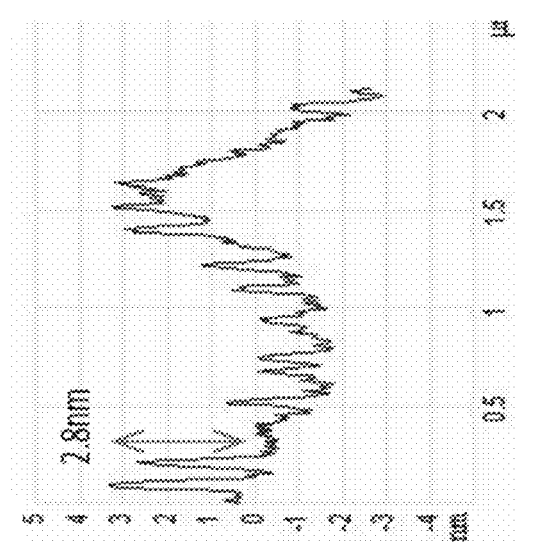
Figure 2D:
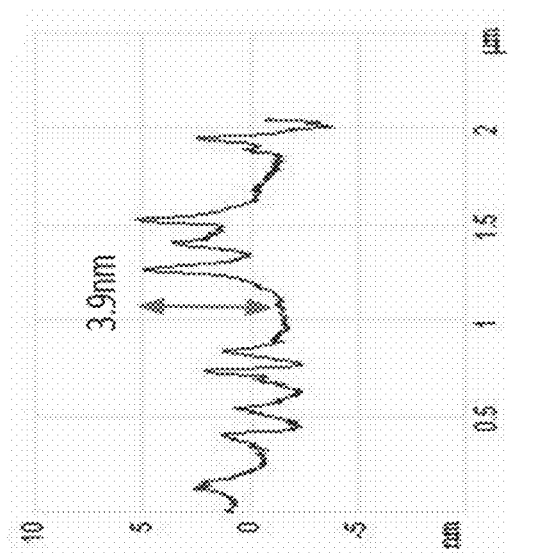

The AFM images of FIGS. 2A-2C were taken after ALD was carried out using sequences of 600 ms TMA pulse and 50 ms $H_2O$ pulse with 500 ms of Ar purge after each precursor pulse. Spherical $Al_2O_3$ nuclei were observed on all three different substrates (white dots). This data is consistent with nuclei formation in the ALD chamber. The size of each image is 2×2 um$^2$. The line profiles in FIGS. 2D-2F shows height profiles along the dotted lines, and provides information about the nuclei along the dotted lines.

Pulse Time Study

Samples were made with different pulse lengths of TMA and $H_2O$ with a fixed Ar purge time of 500 ms. For the sample with 200 ms TMA pulses and 50 ms $H_2O$ pulses $Al_2O_3$ was mainly deposited on the step edges. Although some $Al_2O_3$ was nucleated on the terraces, it was discontinuous with a high density of visible pinholes. The number densities of the $Al_2O_3$ particles (number of particles per 4 μm$^2$ image area) with the three different ALD conditions are shown in Table I.

TABLE I

Number density of $Al_2O_3$ particles from films grown with different ALD conditions (Number of particles per 4 μm$^2$)

| 200 ms TMA & 50 ms $H_2O$ pulses | 600 ms TMA & 50 ms $H_2O$ pulses | 200 ms TMA & 150 ms $H_2O$ pulses |
|---|---|---|
| 59 | 692 | 176 |

For a sample grown using relatively short 200 ms TMA pulses, the density of the $Al_2O_3$ particles (15/μm$^2$) was significantly lower than for samples grown under different conditions with longer TMA pulse times. When the TMA pulse time was increased to 600 ms while fixing the $H_2O$ pulse length, the density of the $Al_2O_3$ particles was markedly increased (123/μm$^2$) and continuous $Al_2O_3$ films were deposited on both terraces and step edges without pinholes. AFM line traces show that the particles are 2±0.6 nm in diameter. The observation of the high density of defects and low density of $Al_2O_3$ particles in the dielectric deposited using short TMA pulses indicates that the $Al_2O_3$ particles play a critical role in the formation of uniform dielectric layers on HOPG during ALD.

When the $H_2O$ pulse time was increased to 150 ms with a fixed TMA pulse time of 200 ms, similar morphology as for the growth with a long TMA pulse was observed. The $Al_2O_3$ film was continuous with a high density of $Al_2O_3$ particles (44/μm2) Data showed that the particles increased in size to 4±0.7 nm. This indicates that the $Al_2O_3$ particles were formed by a CVD component that can be controlled by the TMA and $H_2O$ pulse times. This observation is consistent with both the island formation mechanism and the gas phase formation mechanism for the particles.

Electrical Properties.

MIM capacitors were fabricated on freshly cleaved HOPG and $MoS_2$ substrates. $Al_2O_3$ films were deposited using 50 ALD cycles consisting of 600 ms TMA pulse, 500 ms Ar purge, 50 ms $H_2O$ pulse, and 500 ms Ar purge at 50° C. sample temperature. Subsequently, Ni metal gates were deposited by thermal evaporation. The area of the capacitor was ~1900 μm$^2$ (50 μm diameter). Capacitance-voltage (C-V) and leakage current-voltage (I-V) measurements were performed in order to evaluate the electrical quality of the oxide.

Figures 3A, 3B, 3C:
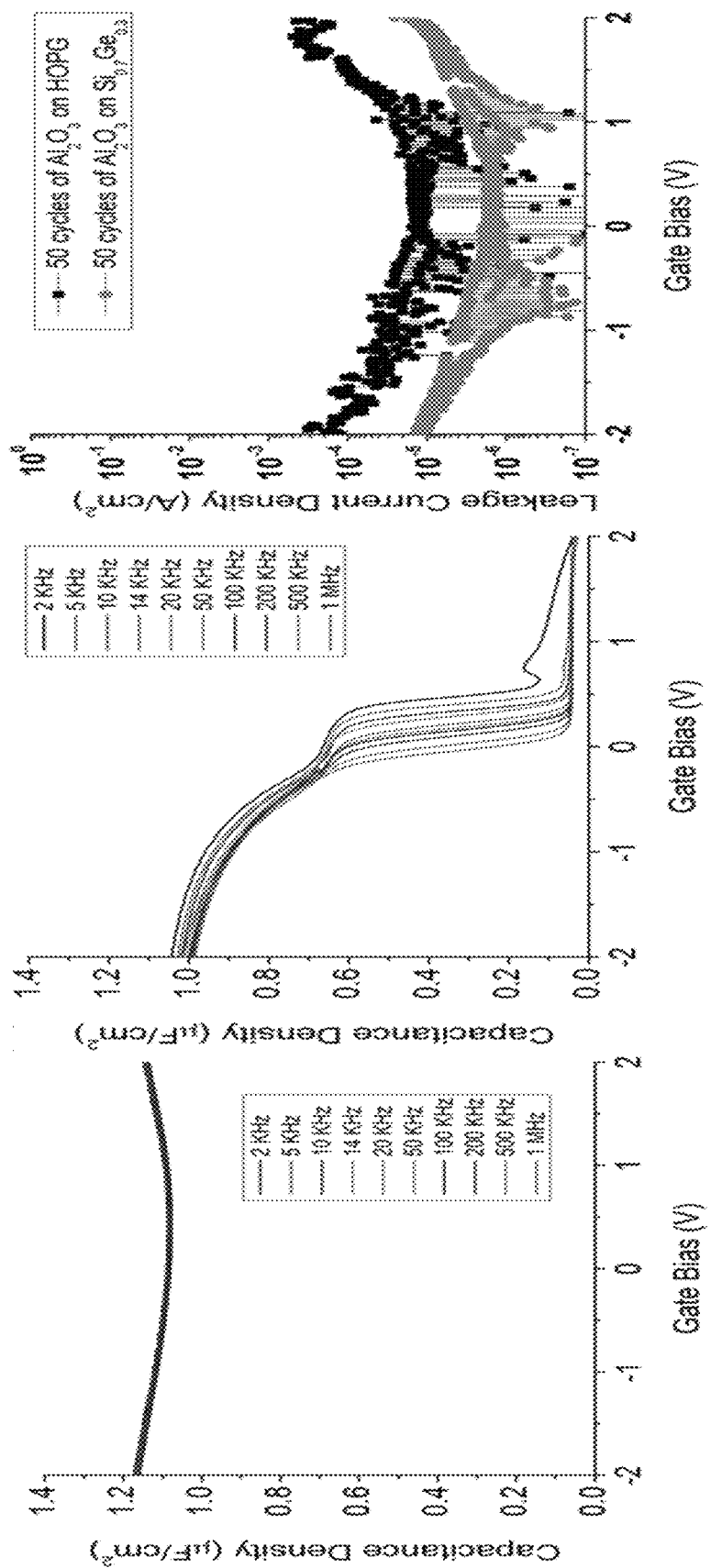
FIGS. 3A-3C are a comparison of Electrical Properties of Low Temperature $Al_2O_3$ ALD on HOPG and $Si_{0.7}Ge_{0.3}$ (001) with cycles consisting of a 600 ms TMA pulse, 500 ms Ar purge, 50 ms $H_2O$ pulse, and 500 ms Ar purge at 50° C. sample temperature.

FIGS. 3A-3C are a comparison of Electrical Properties of Low Temperature $Al_2O_3$ ALD on HOPG and $Si_{0.7}Ge_{0.3}$ (001) with cycles consisting of a 600 ms TMA pulse, 500 ms Ar purge, 50 ms $H_2O$ pulse, and 500 ms Ar purge at 50° C. sample temperature. FIG. 3A is a Capacitance vs. Voltage Curves of Ni/$Al_2O_3$ (50 ALD cycles)/HOPG stack at difference frequencies. FIG. 3B are Capacitance vs. Voltage Curves of Ni/$Al_2O_3$ (50 ALD cycles)/$Si_{0.7}Ge_{0.3}$/Al stack at different frequencies. FIG. 3C are I-V curves of Ni/$Al_2O_3$ (50 ALD cycles)/HOPG and Ni/$Al_2O_3$ (50 ALD cycles)/$Si_{0.7}Ge_{0.3}$/Al stack. The similar Cox on HOGP and $Si_{0.7}Ge_{0.3}$ (001) is consistent with no ALD induction cycles on HOPG. The comparable leakage currents of $Al_2O_3$/HOPG to $Al_2O_3$/$Si_{0.7}Ge_{0.3}$ are consistent with the oxide on HOPG being uniform and pin-hole free on the HOPG substrate.

As shown in FIG. 3A, the capacitance of the oxide was nearly independent of the applied voltage owing to the MIM structure of the capacitor. For single layer graphene, capacitance can be modulated near 0 V due to the linear dispersion of the density of states near the Fermi energy level. However, because of the high charge carrier density of HOPG near the Fermi energy level, the modulation of capacitance was not observed. The Cmax of the oxide was 1.17 μF/cm$^2$ which is consistent with the Cmax value of the ALD grown $Al_2O_3$ on $Si_{0.7}Ge_{0.3}$ (001) as shown in FIG. 3B. This indicates that deposition of $Al_2O_3$ on HOPG proceeded without an ALD induction time. Note the high dispersion of the C-V data on $Si_{0.7}Ge_{0.3}$ was likely due to the formation of GeOx which can be suppressed by $(NH_4)_2S(aq)$ or $NH_3$ plasma treatments and/or diminished with forming gas anneal. FIG. 3C compares the leakage currents of $Al_2O_3$ films grown by 50 ALD cycles on HOPG and $Si_{0.7}Ge_{0.3}$ (001) substrates. ALD was performed simultaneously at 50° C. sample temperature on the two substrates. The leakage current of the oxide on the HOPG was 3.1×10$^{-5}$ A/cm$^2$ and 2.2×10$^{-6}$ A/cm$_2$ for the $Si_{0.7}Ge_{0.3}$ at −1 V. The low leakage on $Si_{0.7}Ge_{0.3}$ is expected since $Al_2O_3$ readily nucleates on $Si_{0.7}Ge_{0.3}$ (001), and the $Si_{0.7}Ge_{0.3}$ (001) surface is flat without bunched steps. Conversely, HOPG surfaces are inert and have bunched steps. The leakage current of the ALD grown $Al_2O_3$ on HOPG at 50° C. sample temperature being within 15× of the leakage current on $Si_{0.7}Ge_{0.3}$ (001) is consistent with the oxide on HOPG being uniform and pin-hole free on the HOPG substrate Additional experiments showed that an $Al_2O_3$ layer prepared by this ALD technique can be used as a good seeding layer for higher dielectric gate oxide such as $HfO_2$. By making a bilayer stack consisting of bottom $Al_2O_3$—$HfO_2$, higher Cox and lower EOT can be achieved. This was confirmed by examining electrical properties of MOSCAPs of $MoS_2$, HOPG and $Si_{0.7}Ge_{0.3}$ (001) substrates with the bilayer gate oxide stacks. An identical preparation method was used for all substrates. 10 cycles of $Al_2O_3$ films were deposited using 600 ms TMA pulse, 500 ms Ar purge, 50 ms $H_2O$ pulse, and 500 ms Ar purge at 50° C. sample temperature. $HfO_2$ was deposited by consecutive cycles of 500 ms of TDMAH and 500 ms of $H_2O$ at 250° C. with 6 s long Ar purges after each precursor dose. Identical Ni metal gates were deposited by thermal evaporation. Insulating oxide was successfully deposited on three different samples. Cmax value was almost increased by factor of 2, compared to the samples on which 50 cycles of $Al_2O_3$ was deposited. The identical Cmax value among different substrates indicates that the oxide has same good quality on different surfaces. Comparable leakage currents of $HfO_2/Al_2O_3/HOPG$ and $HfO_2/Al_2O_3/MoS_2$ to $HfO_2/Al_2O_3/Si_{0.7}Ge_{0.3}$ are consistent with the oxide on HOPG being uniform and pin-hole free on the HOPG and $MoS_2$ substrates.

This technique can be also employed to 3D structure materials such as $MoS_2$ Nanotubes. However, when using cross-flow type ALD, samples should be rotated during ALD process in order to obtain conformal deposition on the entire structures. Otherwise, non-uniform oxide could be produced due to the directional deposition along the gas flow in the chamber. $MoS_2$ nanotubes were transferred by the edge of a dicing tape (Purchased from Semiconductor Equip. Corp, part number: 18074-9.00) on 27 nm of $Al_2O_3$ deposited by ALD onto a Si wafer. To remove possible polymer residues on the nanotube surface, the sample was transferred to a commercial UHV (Ultra High Vacuum) chamber under pressure of $10^{-10}$ torr and then annealed at 300 C for 10 min. After the UHV cleaning, 50 cycles of $Al_2O_3$ ALD with 600 ms of TMA pulse, 500 ms of Ar purge, 50 ms of $H_2O$ pulse and 500 ms of Ar purge was performed at 50° C. To avoid non-uniform deposition problem mentioned above, sample was rotated by 90 degrees after every 12 cycles. The $Al_2O_3$ deposited in this manner resulted in 5 nm thick uniform layer on the structure. $HfO_2$—$Al_2O_3$ Bilayer gate oxide stack was also employed to obtain higher Cox. 10 cycles of $Al_2O_3$ ALD with the identical recipe above was performed at 50° C. to provide a seeding layer for $HfO_2$ ALD. 40 cycles of $HfO_2$ was deposited on top of $Al_2O_3$ by 500 ms of TDMAH and 500 ms of $H_2O$ pulse with 6 s Ar purges after each precursor dose at 250° C. The oxide showed same uniform deposition on the $MoS_2$ nanotube surface with 5 nm thickness.

The invention can also be applied to form devices such as FETs (Field Effect transistors), tunnel devices, display materials, memory devices (flash, DRAM etc), solar cells and etc. An example is selector devices for Resistive RAM or Flash or any cross-point memory. Ultrathin uniform conductive oxides such as indium tin oxide (ITO) can also be deposited on inert metals for memory applications, display materials or solar cells; ultrathin uniform conductive oxides can be deposited on 2D materials for displays or when the 2D materials is used in logic as a channel or diffusion barrier layers. In the devices, oxide layers are sometimes deposited on noble metal surfaces such as Pt, Au, and the oxide layers usually result in defective and non-uniform oxides with unacceptably high leakage current. The low temperature ALD can be used to initiate nucleation on such noble or inert metal surfaces. Using the technique, conformal and insulating $Al_2O_3$ was successfully prepared on Au gate electrodes.

Figure 4:
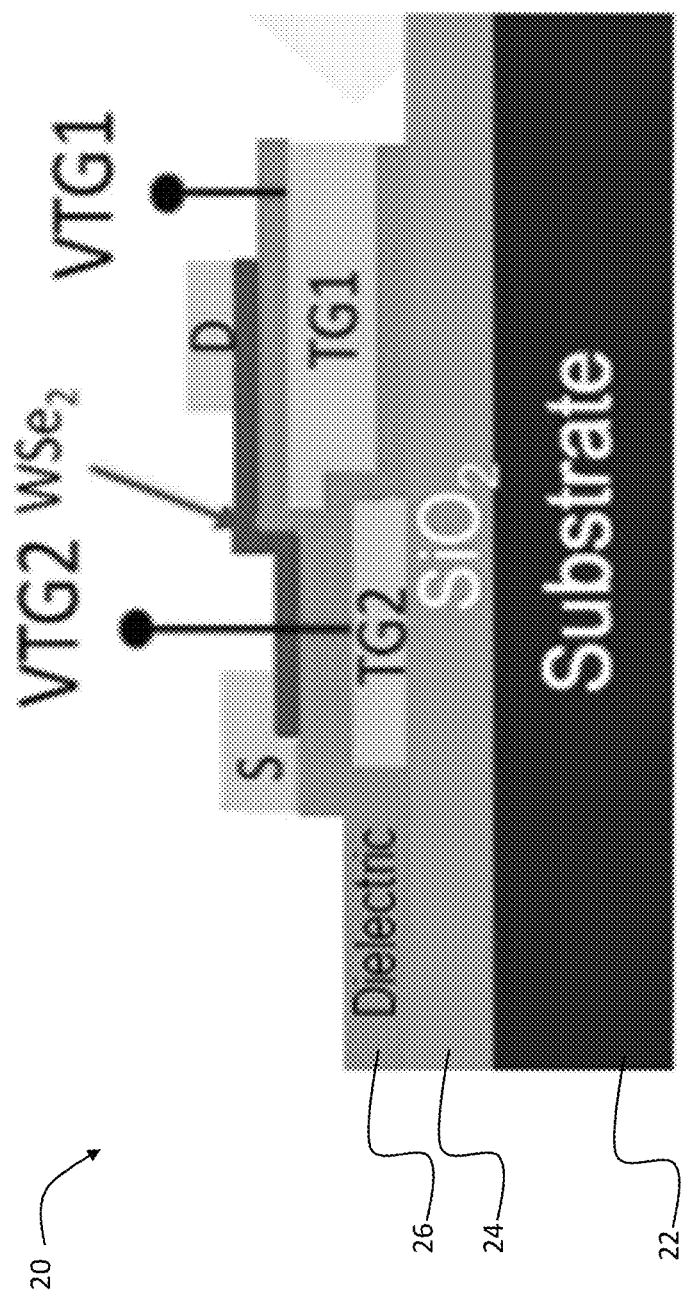
FIG. 4 is a cross-sectional schematic diagram of a dual bottom gated Field Effect Transistor to which the present ALD method was employed to form nanolaminate gate oxides (the device structure and diagram are from the lab of Prof Zhihong Chen of Purdue, and the structure was used to test dielectrics of the present invention)

FIG. 4 shows a cross-sectional schematic diagram of a dual bottom gated Field Effect Transistor 20 to which the present ALD method was employed to form nanolaminate gate oxides (the device structure and diagram are from the lab of Prof Zhihong Chen of Purdue, and the structure was used to test dielectrics of the present invention). The device was formed on a Si substrate 22 topped with an $SiO_2$ dielectric layer 24. Two gate electrodes (TG1 and TG2) were isolated via nanolamiate oxides. A 1 nm thick Ti gate electrode was deposited on $SiO_2$ on the Si substrate by e-beam evaporation and then 9 nm Au was deposited on top of the electrode. Prior to ALD, the sample was cleaned by rinsing with Acetone, IPA and $H_2O$, respectively. 10 cycles of $Al_2O_3$ ALD with 600 ms TMA pulse, 500 ms Ar purge, 50 ms $H_2O$ pulse, and 500 ms Ar purge was performed at 50° C. to provide a seeding layer. 40 cycles of $HfO_2$ ALD was deposited on top of $Al_2O_3$ by 500 ms of TDMAH and 500 ms of $H_2O$ pulse with 6 s Ar purges after each precursor dose at 250° C. The bilayer oxide prepared by this technique was insulting and the leakage current of the oxide was as low as $10^{-9}$ $\mu A/\mu m^2$. TG2 consisted of 1 nm Ti (bottom) and 9 nm of Au (top). A device dielectric layer 26 was deposited by 10 cycles of $Al_2O_3$ ALD at 50° C. and 40 cycles of $HfO_2$ ALD at 250° C. S(Source), D (Drain) were prepared by e-beam evaporation.

Experiments investigated a combined sequential low temperature (<100° C.) and high temperature (>200° C.) ALD oxide formation. 7 cycles of $Al_2O_3$ layer were deposited at 50° C. as a seeding layer. Afterwards, ALD reactor temperature was increased to 300° C. and 40 cycle of $HfO_2$ ALD was deposited with $HfCl_4$ and $H_2O$ on top of $Al_2O_3$. For comparison, identical oxides were deposited on $MoS_2$, HOPG and $Si_{0.7}Ge_{0.3}$ (001). The same MOS CAP fabrication process was employed that was used for the pure $Al_2O_3$ MOSCAPs. However, the Cmax value was increased by factor of 2 (~2 $\mu F/cm^2$), compared to that of 50 cycles of $Al_2O_3$ due to the higher dielectric constant of $HfO_2$. The identical Cmax value for the different substrates is consistent with identical growth rates and no inductions period during the ALD. Comparable leakage currents among the three samples indicated the oxides are insulating and uniform on both 2D materials and $Si_{0.7}Ge_{0.3}$ (001) substrate.

The effect of the oxygen scavenging by Ti/TiN metal gate on a gate oxide was also investigated. Pd/Ti/TiN top gates were fabricated on the $HfO_2/Al_2O_3$ bilayer oxide (10 cycle of $Al_2O_3$ at 50° C. (interface)/40 cycle of $HfO_2$ at 300° C.) by DC sputtering. Identical oxides and gates were deposited on $MoS_2$, HOPG and $Si_{0.7}Ge_{0.3}$ (001) and the MOSCAP fabrication process was identical to the bilayer MOSCAP with nonreactive gates. FIGS. 5A-5C present the capacitance-voltage measurements. The Cmax of the three MOSCAPs was increased to ~2.7 $\mu F/cm^2$ which was about 30% higher compared to a $HfO_2/Al_2O_3$ bilayer stack with Ni Gate. This improvement suggests that Pd/Ti/TiN gate scavenge oxygen from the gate oxide resulting in an increase of dielectric constant of the layer or thinner interface oxide layer (for SiGe). The Cmax of $Si_{0.7}Ge_{0.3}$ (001) MOSCAPs was higher (~3.0 $\mu F/cm^2$) compared to $MoS_2$, HOPG. This fact indicates that the scavenging oxygen is more effective on $Si_{0.7}Ge_{0.3}$ (001) than $MoS_2$ and HOPG since there is an SiGeOx interlayer. FIGS. 5D-5F show the leakage current measurement of three MOSCAPS. Leakage current density showed that lower EOT was achieved without increase of leakage current.

Figure 6A:
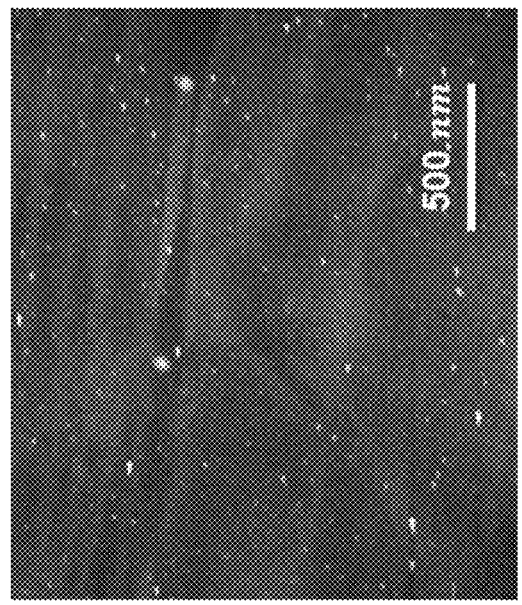
FIGS. 6A and 6B are AFM images of 50 cycle of $Al_2O_3$ films on bulk $MoS_2$ with different purge times that demonstrate sub 1 nm surface roughness created by $Al_2O_3$ nanoparticles.
Figure 6B:
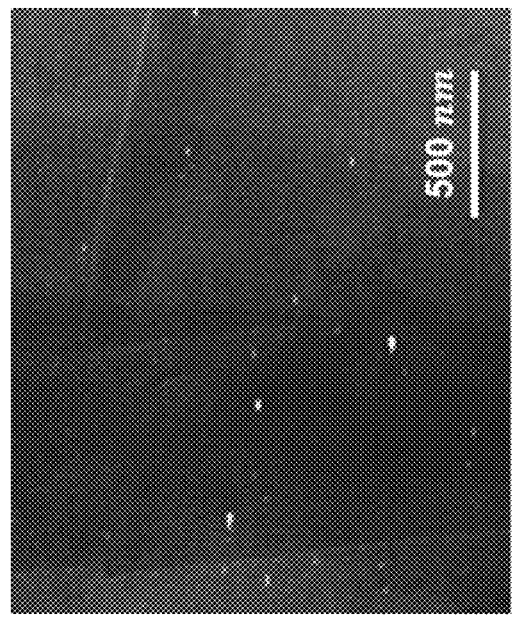

As shown in FIGS. 6A and 6B, with optimized pulse and purge times the vast majority of the $Al_2O_3$ nuclei can be reduced in size below the resolution of the AFM which is about 1 nm. There a few large nuclei (<1%) which are dust from the ALD reactor. The nanofog films in FIGS. 6A-6B were produced via 50 cycles of $Al_2O_3$ films on bulk $MoS_2$ with different purge times. The FIG. 6A nanfog film 50 ALD cycle consisted of a 600 ms TMA pulse, a 500 ms Ar purge, a 50 ms $H_2O$ pulse, and a 3 s Ar purge. The FIG. 6B nanofog film 50 ALD cycle consisted of a 600 ms TMA pulse, a 500 ms Ar purge, a 50 ms $H_2O$ pulse, and a 3 s Ar purge at 50° C. The size of the images is 2×2 $um^2$. The nanofog films consist essential of sub-1 nm particle and provide a platform for further ALD depositions.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A semiconductor structure comprising a nanofog oxide adhered to an inert 2D or 3D surface or a weakly reactive metal surface, the nanofog oxide consisting essentially of 0.5-2 nm $Al_2O_3$ nanoparticles.

2. The semiconductor structure of claim 1, wherein the surface is an unfunctionalized surface.

3. The semiconductor structure of claim 1, comprising additional oxide on the 0.5-5 nm diameter $Al_2O_3$ nanoparticles.

4. The semiconductor structure of claim 3, wherein the additional oxide comprises $Al_2O_3$.

5. The semiconductor structure of claim 3, wherein the additional oxide comprises $HfO_2$.

6. The semiconductor structure of claim 3, wherein the additional oxide is selected from the group consisting of $ZrO_2$, $HfZrO_2$, silicon or other doped $HfO_2$ or $ZrO_2$, $ZrTiO_2$, $HfTiO_2$, $La_2O_3$, $Y_2O_3$, $Ga_2O_3$, $Gd_3Ga_5O_{12}$, and alloys thereof, including the ferroelectric phases of $HfZrO_2$, silicon or other doped $HfO_2$ or $ZrO_2$.

7. The semiconductor structure of claim 1, wherein the inert surface comprises a 2D semiconductor substrate.

8. The semiconductor structure of claim 7, wherein the 2D semiconductor substrate is selected from the group consisting of graphene, HOPG (Highly oriented pyrolytic graphite), and TMDs (transition metal dichalcogenides).

9. The semiconductor structure of claim 8, wherein the TMDs are $MoS_2$, $WeSe_2$.

10. The semiconductor structure of claim 1, wherein the inert surface is the surface of a 3D material.

11. The semiconductor structure of claim 10, wherein the 3D material is selected from the group consisting of nanowires and nanotubes.

12. The semiconductor structure of claim 1, wherein the weakly reactive metal surface is selected from the group consisting of Pt, Au, and Ru.

13. The semiconductor structure of claim 1, wherein the inert 2D surface is a surface selected from the group of HOPG and $MoS_2$ substrates, comprising additional $Al_2O_3$ on the 0.5-2 nm diameter $Al_2O_3$ nanoparticles and a metal gate formed on the additional $Al_2O_3$.

14. The semiconductor structure of claim 13, wherein the additional oxide comprises a bilayer stack of $Al_2O_3$-$HfO_2$.

15. The semiconductor structure of claim 1, in a field effect transistor, the transistor comprising:
   a semiconductor substrate with a dielectric layer, gate electrodes isolated from each other by nanolaminate oxide comprising the 0.5-2 nm diameter $Al_2O_3$ nanoparticles and additional oxide with one of the gate electrodes contacting the semiconductor substrate and the other being isolated from the semiconductor substrate by the nanolaminate oxide;
   high-K dielectric formed on the nanolaminate oxide; and
   source and drain contacts upon the high-K dielectric, one of the source and drain contacts also contacting the nanolaminate oxide.

16. The semiconductor structure of claim 15, wherein the additional oxide comprises a bilayer stack of $Al_2O_3$-$HfO_2$.

17. The semiconductor structure of claim 1, wherein the inert 2D material or inert 3D surface or a weakly reactive metal surface is selected from the group consisting of $MoS_2$, HOPG, and SiGe.

18. The semiconductor structure of claim 17, comprising additional oxide on the nanofog oxide, wherein the additional oxide comprises a bilayer stack of $Al_2O_3$-$HfO_2$.

19. The semiconductor structure of claim 1, wherein the nanofog oxide consists essentially of sub 1 nm diameter $Al_2O_3$ nanoparticles.

* * * * *